United States Patent
Lin

(10) Patent No.: US 9,268,422 B2
(45) Date of Patent: Feb. 23, 2016

(54) TOUCH PANEL WITH PHOTOVOLATIC CONVERSION FUNCTION

(71) Applicant: Chih-Chung Lin, Taipei (TW)

(72) Inventor: Chih-Chung Lin, Taipei (TW)

(*) Notice: Subject to any disclaimer, the term of this patent is extended or adjusted under 35 U.S.C. 154(b) by 574 days.

(21) Appl. No.: 13/726,188

(22) Filed: Dec. 23, 2012

(65) Prior Publication Data

US 2014/0125603 A1    May 8, 2014

(30) Foreign Application Priority Data

Nov. 7, 2012 (TW) .............................. 101141308 A

(51) Int. Cl.
| | | |
|---|---|---|
| H01L 33/00 | (2010.01) | |
| G06F 3/041 | (2006.01) | |
| H01L 31/0216 | (2014.01) | |
| H01L 31/048 | (2014.01) | |
| H01L 31/02 | (2006.01) | |
| H01L 31/0445 | (2014.01) | |

(52) U.S. Cl.
CPC .......... *G06F 3/041* (2013.01); *H01L 31/02008* (2013.01); *H01L 31/02168* (2013.01); *H01L 31/048* (2013.01); *H01L 31/0445* (2014.12); *G06F 2203/04103* (2013.01); *Y02E 10/50* (2013.01)

(58) Field of Classification Search
CPC .......... G06F 3/02; G06F 3/033; G06F 3/041; G06F 3/042; G06F 3/048; G09F 3/32; G09F 3/36; G09F 3/041; G09F 3/045; H01L 33/00
USPC .............. 345/88, 98, 168, 173–176; 174/255; 715/810; 178/18.09, 20.2
See application file for complete search history.

(56) References Cited

U.S. PATENT DOCUMENTS

| | | | | |
|---|---|---|---|---|
| 4,567,480 | A * | 1/1986 | Blanchard ..................... | 345/175 |
| 2006/0097975 | A1 * | 5/2006 | Lee et al. ......................... | 345/98 |
| 2006/0109222 | A1 * | 5/2006 | Lee et al. ......................... | 345/88 |
| 2008/0018612 | A1 * | 1/2008 | Nakamura et al. ............. | 345/173 |
| 2008/0122803 | A1 * | 5/2008 | Izadi et al. ..................... | 345/175 |
| 2010/0277431 | A1 * | 11/2010 | Klinghult ...................... | 345/174 |
| 2011/0202875 | A1 * | 8/2011 | Kimura ........................ | 715/810 |
| 2011/0205178 | A1 * | 8/2011 | Yoshida et al. ................ | 345/173 |
| 2011/0298718 | A1 * | 12/2011 | Chang et al. .................. | 345/168 |
| 2012/0010834 | A1 * | 1/2012 | Shiotani et al. ................. | 702/64 |
| 2013/0050147 | A1 * | 2/2013 | Tseng et al. ................... | 345/175 |

* cited by examiner

*Primary Examiner* — Xiaoliang Chen
(74) *Attorney, Agent, or Firm* — C. G. Mersereau; Nikolai & Mersereau, P.A.

(57) ABSTRACT

A touch panel with photovoltaic conversion function includes a touch zone and a non-touch zone located immediately around the touch zone. The touch zone includes, from top to bottom, a first transparent substrate, a photovoltaic conversion layer, a touch electrode layer and a second transparent substrate. The photovoltaic conversion layer has an upper side attached to a lower side of the first transparent substrate, and the touch electrode layer is formed on an upper side of the second transparent substrate and attached to a lower side of the photovoltaic conversion layer. The touch panel having the above arrangements enables the photovoltaic conversion layer to have effectively increased light-absorption areas to convert more light into more electric current.

12 Claims, 7 Drawing Sheets

TOUCH PANEL WITH PHOTOVOLATIC CONVERSION FUNCTION

This application claims the priority benefit of Taiwan patent application number 101141308 filed on Nov. 7, 2012.

FIELD OF THE INVENTION

The present invention relates to a touch panel, and more particularly to a touch panel including a photovoltaic conversion layer, which has increased light-absorption areas to convert more light into more electric current for use by the touch panel, so that the touch panel can have effectively extended standby and operation time.

BACKGROUND OF THE INVENTION

Power supply plays a very important role in the length of standby and operation time of a general portable electronic device. The currently available portable electronic devices rely on the electric power supplied by their built-in battery to maintain operation thereof. For a portable electronic device that includes a large screen and a touch device, more power will be consumed during its operation to thereby largely shorten the length of standby and operation time thereof.

One of the ways for solving the problem of large power consumption of the conventional portable electronic device is to combine a solar module with the portable electronic device. The solar module enables photovoltaic conversion and stores the converted electric energy in the built-in battery of the portable electronic device, so that the portable electronic device can have extended standby and operation time. The solar module is mainly arranged in a non-touch zone or a housing of the portable electronic device. For the solar module to absorb light irradiated thereon and convert the absorbed light into electric current, the portable electronic device must have a transparent housing or allow the solar module to expose from the housing. As a result, the portable electronic device would disadvantageously have a large overall thickness.

It is therefore tried by the inventor to develop a touch panel with photovoltaic conversion function to overcome the problems and drawbacks in the conventional solar module.

SUMMARY OF THE INVENTION

A primary object of the present invention is to provide a touch panel with photovoltaic conversion function, which includes a photovoltaic conversion layer having increased light-absorption areas to convert more light into more electric current for use by the touch panel, so that the touch panel can have effectively extended standby and operation time.

Another object of the present invention is to provide a touch panel with photovoltaic conversion function, which has a reduced overall thickness.

To achieve the above and other objects, the touch panel with photovoltaic conversion function according to the present invention includes a touch zone and a non-touch zone located immediately around the touch zone. The touch zone includes, from top to bottom, a first transparent substrate, a photovoltaic conversion layer, a touch electrode layer and a second transparent substrate. The photovoltaic conversion layer has an upper side attached to a lower side of the first transparent substrate, and the touch electrode layer is formed on an upper side of the second transparent substrate and attached to a lower side of the photovoltaic conversion layer. By providing the photovoltaic conversion layer between the first and the second transparent substrate, the photovoltaic conversion layer can have effectively increased light-absorption areas to convert more light into more electric current for use by the touch panel, so that the touch panel can have effectively extended standby and operation time.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
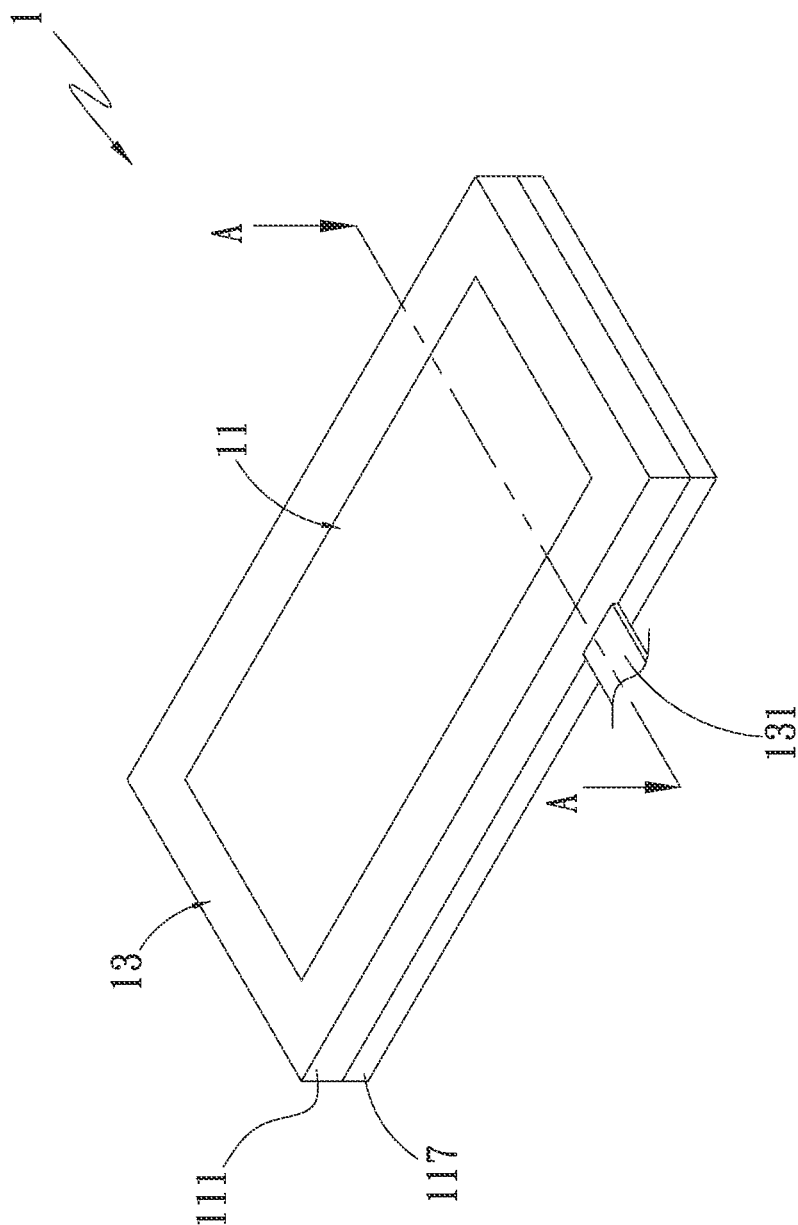
FIG. 1 is a top perspective view of a touch panel with photovoltaic conversion function according to the present invention.

The present invention will now be described with some preferred embodiments thereof and with reference to the accompanying drawings. For the purpose of easy to understand, elements that are the same in the preferred embodiments are denoted by the same reference numerals.

Please refer to FIG. 1 that is a top perspective view of a touch panel with photovoltaic conversion function according to the present invention. For the purpose of conciseness and clarity, the present invention is herein also briefly referred to as "the touch panel" and generally denoted by reference numeral 1.

Figure 2:
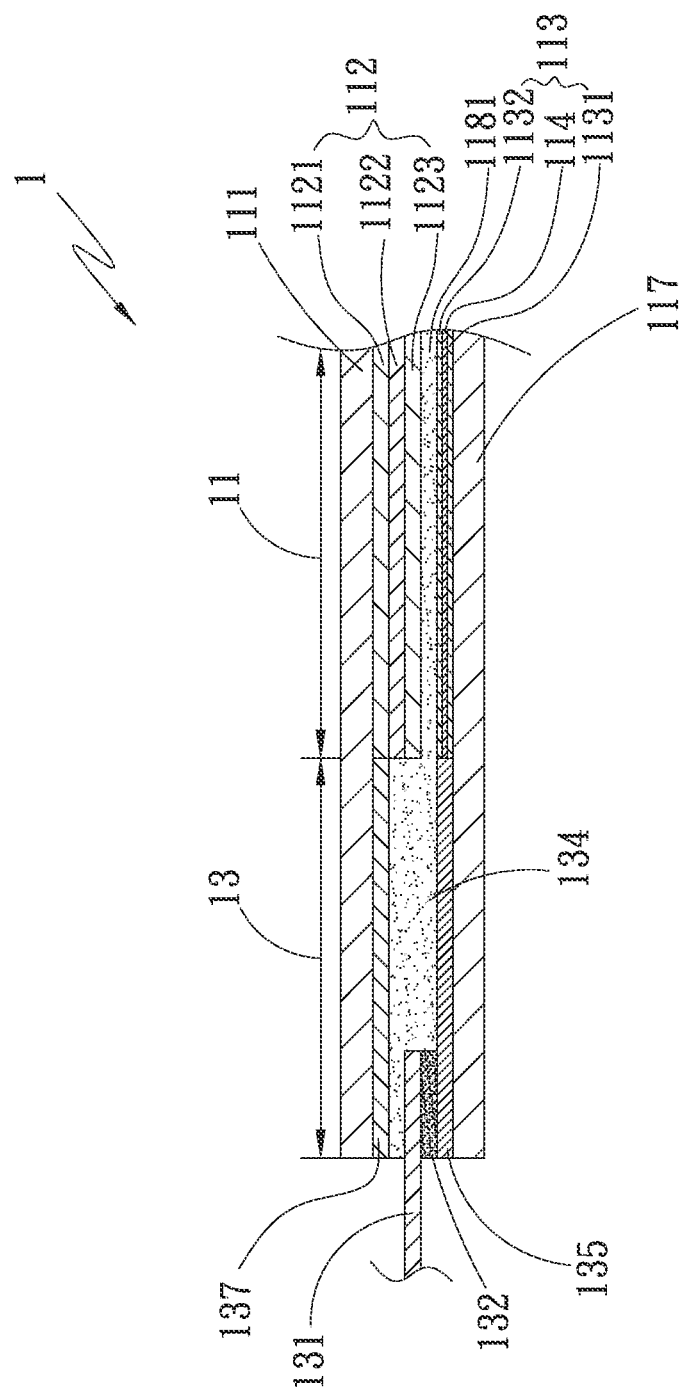
FIG. 2 is a sectional view taken along line A-A of FIG. 1, showing the structure of the touch panel of the present invention according to a first preferred embodiment thereof.

FIG. 2 is a sectional view taken along line A-A of FIG. 1 showing the structure of the touch panel 1 according to a first preferred embodiment thereof. As shown, in the first preferred embodiment, the touch panel 1 includes a touch zone 11 and a non-touch zone 13. The touch zone 11 includes, from top to bottom, a first transparent substrate 111, a photovoltaic conversion layer 112, a touch electrode layer 113, and a second transparent substrate 117. In the illustrated first preferred embodiment, the first and the second substrate 111, 117 are respectively made of a glass material. However, it is understood, in practical implementation of the present invention, the first and the second transparent substrate 111, 117 can be respectively made of other materials, such as polyethylene terephthalate (PET), polycarbonate (PC), polyethylene (PE), polyvinylchloride (PVC), polypropylene (PP), polystyrene (PS), polymethylmethacrylate (PMMA), or cyclo olefin copolymer (COC).

Further, the photovoltaic conversion layer 112 can be a thin-film solar cell, such as an amorphous silicon (a-Si) thin-film solar cell, a gallium arsenide (GaAs) thin-film solar cell, a cadmium telluride (CdTe) thin-film solar cell, a copper indium gallium selenide (CIGS) thin-film solar cell, or a Dye-sensitized solar cell (DSSC). The photovoltaic conversion layer 112 has an upper side attached to a lower side of the first transparent substrate 111 and a lower side attached to an upper side of the touch electrode layer 113. Further, the photovoltaic conversion layer 112 includes, from top to bottom, a first transparent electrode layer 1121, a light-absorption layer 1122, and a second transparent electrode layer 1123.

The first transparent electrode layer 1121 is a transparent conductive oxide (TCO) with high transmissivity and high conductivity, and is attached to the lower side of the first transparent substrate 111. The second transparent electrode layer 1123 is a metal layer. In the first preferred embodiment, the metal layer can be a silver (Ag) layer, an aluminum (Al) layer or a chromium (Cr) layer without being limited thereto.

As can be seen in FIG. 2, the light-absorption layer 1122 is located between the first and the second transparent electrode layer 1121, 1123 for receiving light transmitted through the first transparent substrate 111. The received light is subjected to photovoltaic conversion to generate electric energy between the first and the second transparent electrode layer 1121, 1123. The generated electric energy can be supplied to the touch panel 1, enabling the touch panel 1 to have extended standby and operation time.

Therefore, by providing the photovoltaic conversion layer 112 in the touch zone 11 between the first and the second transparent substrate 111, 117, the photovoltaic conversion layer 112 can have increased light-absorption areas to convert more light into more electric current. With this arrangement, the problems of the conventional solar module provided in the non-touch zone as having limited light-absorption areas and low photovoltaic conversion efficiency can be overcome.

A first optical adhesive layer 1181, such as an optical clear adhesive (OCA), an optical clear resin (OCR) or a liquid adhesive lamination (LAL), is provided between the second transparent substrate 117 and the photovoltaic conversion layer 112 for binding or attaching the second transparent substrate 117 and the touch electrode layer 113 on an upper side thereof to the second transparent electrode layer 1123.

In the illustrated first preferred embodiment, the touch electrode layer 113 is formed on the upper side of the second transparent substrate 117 by way of sputtering deposition. However, it is understood, in practical implementation of the present invention, the touch electrode layer 113 can be otherwise formed on the upper side of the second transparent substrate 117 by way of applying a gel layer, electrical plating or vapor deposition.

As can be seen in FIG. 2, the touch electrode layer 113 includes a first sensing electrode 1131 and a second sensing electrode 1132, which can be thin films of indium tin oxide (ITO) or antimony tin oxide (ATO) and are formed on the upper side of the second transparent substrate 117 to cross one another. In other words, the first sensing electrode 1131 and the second sensing electrode 1132 are extended transversely (i.e. in X-axis direction) and longitudinally (i.e. in Y-axis direction), respectively, on the upper side of the second transparent substrate 117 at different elevations. More specifically, the second sensing electrode 1132 is located above the first sensing electrode 1131 while crossing the latter. And, an insulating layer 114 is provided between the lower first sensing electrode 1131 and the higher second sensing electrode 1132.

In FIG. 2, the touch electrode layer 113 forms a single-sided indium tin oxide (SITO) structure, for example, on the upper side of the second transparent substrate 117. However, in practical implementation of the present invention, the touch panel 1 can be designed according to different requirements for transmissivity and stability to include a double-sided indium tin oxide (DITO) structure. That is, as shown in FIG. 3, according to a variant of the first preferred embodiment of the present invention, the touch electrode layer 113 includes a first sensing electrode 1131 provided on the upper side of the second transparent substrate 117 and a second sensing electrode 1132 provided on a lower side of the second transparent substrate 117, so that the touch electrode layer 113 forms a double-sided ITO structure on the second transparent substrate 117.

As shown in FIGS. 1 and 2, the non-touch zone 13 is located immediately around the touch zone 11 and includes a flexible circuit board 131, a conductive adhesive layer 132, an electrode trace layer 135, a second optical adhesive layer 134, and a shielding layer 137. The shielding layer 137 is attached to the lower side of the first transparent substrate 111. The second optical adhesive layer 134 can be a layer of optical clear adhesive (OCA), an optical clear resin (OCR) or a liquid adhesive lamination (LAL), and is provided between the shielding layer 137, the flexible circuit board 131 and the electrode trace layer 135. Further, the second optical adhesive layer 134 is located adjacent to and connected with the first optical adhesive layer 1181.

The conductive adhesive layer 132 is provided on an upper side of the electrode trace layer 135 to bond to the flexible circuit board 131, so that the conductive adhesive layer 132, the flexible circuit board 131 and the electrode trace layer 135 are electrically connected to one another. The electrode trace layer 135 has a lower side attached to the upper side of the second transparent substrate 117.

Figure 3:
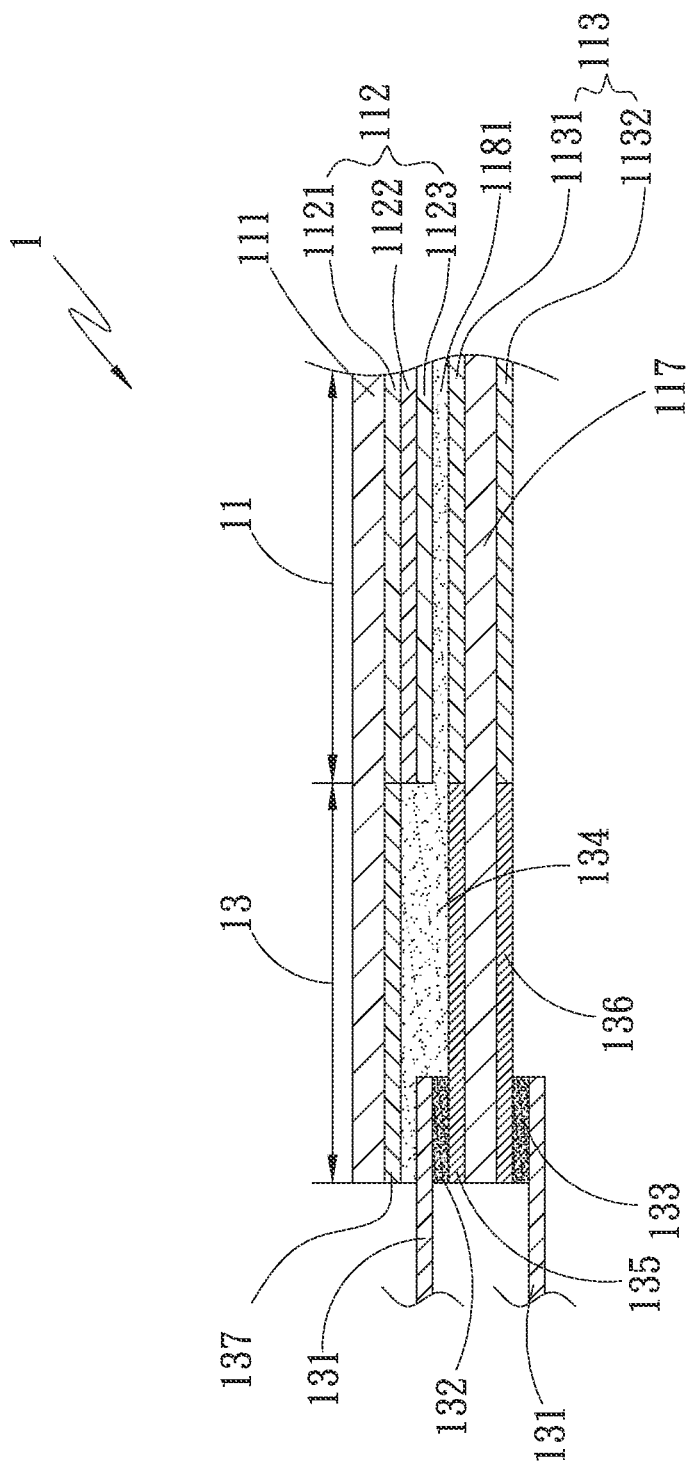
FIG. 3 is a sectional view similar to FIG. 2 showing a variant of the first preferred embodiment of the touch panel of the present invention.

In the variant of the first preferred embodiment as shown in FIG. 3, of which the touch electrode layer 113 is a double-sided ITO structure formed on the second transparent substrate 117, the conductive adhesive layer 132 in the non-touch zone 13 is provided on the upper side of the electrode trace layer 135 to bond to an end of the flexible circuit board 131, so that the electrode trace layer 135 is electrically connected to one end of the flexible circuit board 131 via the conductive adhesive layer 132. That is, the upper side of the electrode trace layer 135 is attached to the conductive adhesive layer 132 and the second optical adhesive layer 134, and the lower side of the electrode trace layer 135 is attached to the upper side of the second transparent substrate 117. Meanwhile, an additional electrode trace layer 136 has an upper side attached to the lower side of the second transparent substrate 117 and a lower side attached to an additional conductive adhesive layer 133, which is bonded to another end of the flexible circuit board 131, such that the additional electrode trace layer 136 is electrically connected to the other end of the flexible circuit board 131 via the additional conductive adhesive layer 133.

Thus, the touch panel 1 of the present invention with the above arrangements enables the photovoltaic conversion layer 112 to have increased light-absorption areas and accordingly, to convert more light into more electric current, which in turn enables the touch panel 1 to have extended standby and operation time.

Figure 4:
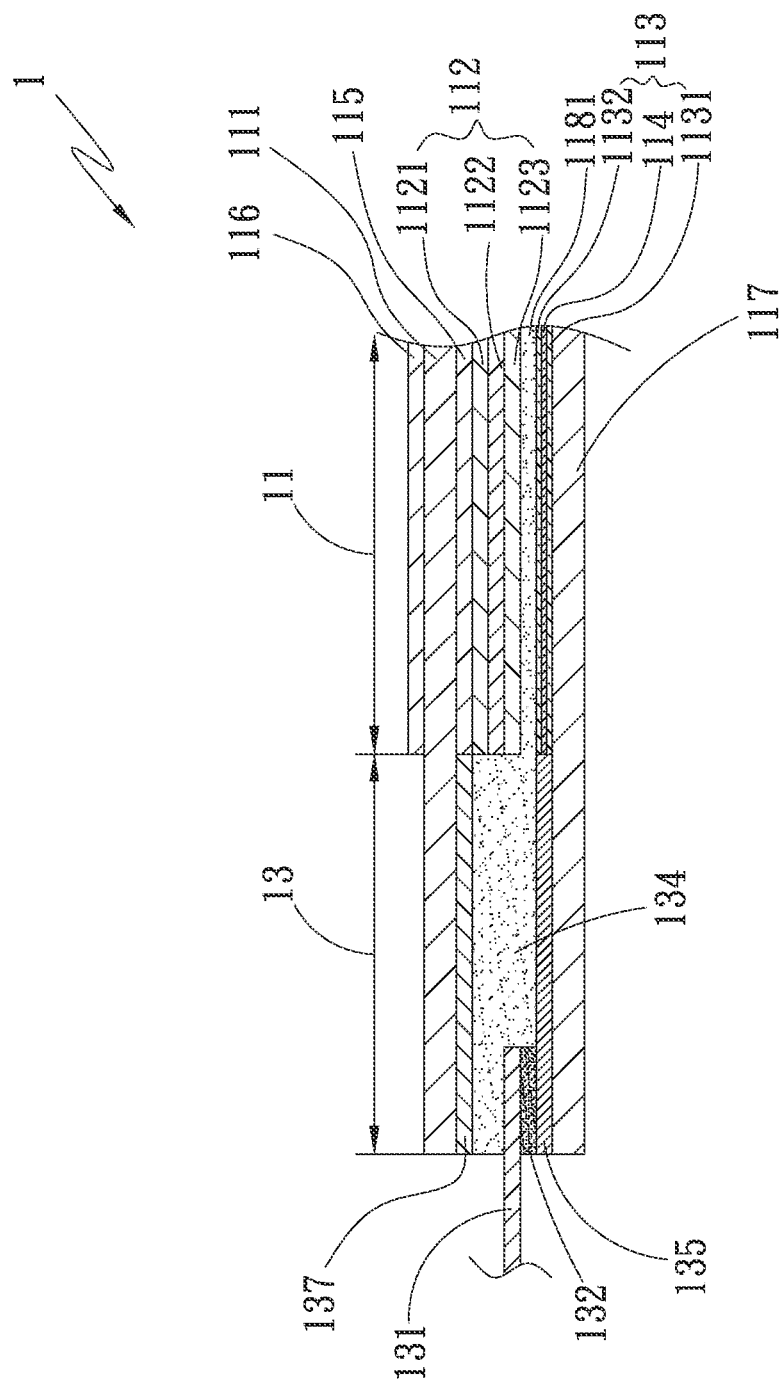
FIG. 4 is a sectional view taken along line A-A of FIG. 1, showing the structure of the touch panel of the present invention according to a second preferred embodiment thereof.
Figure 5:
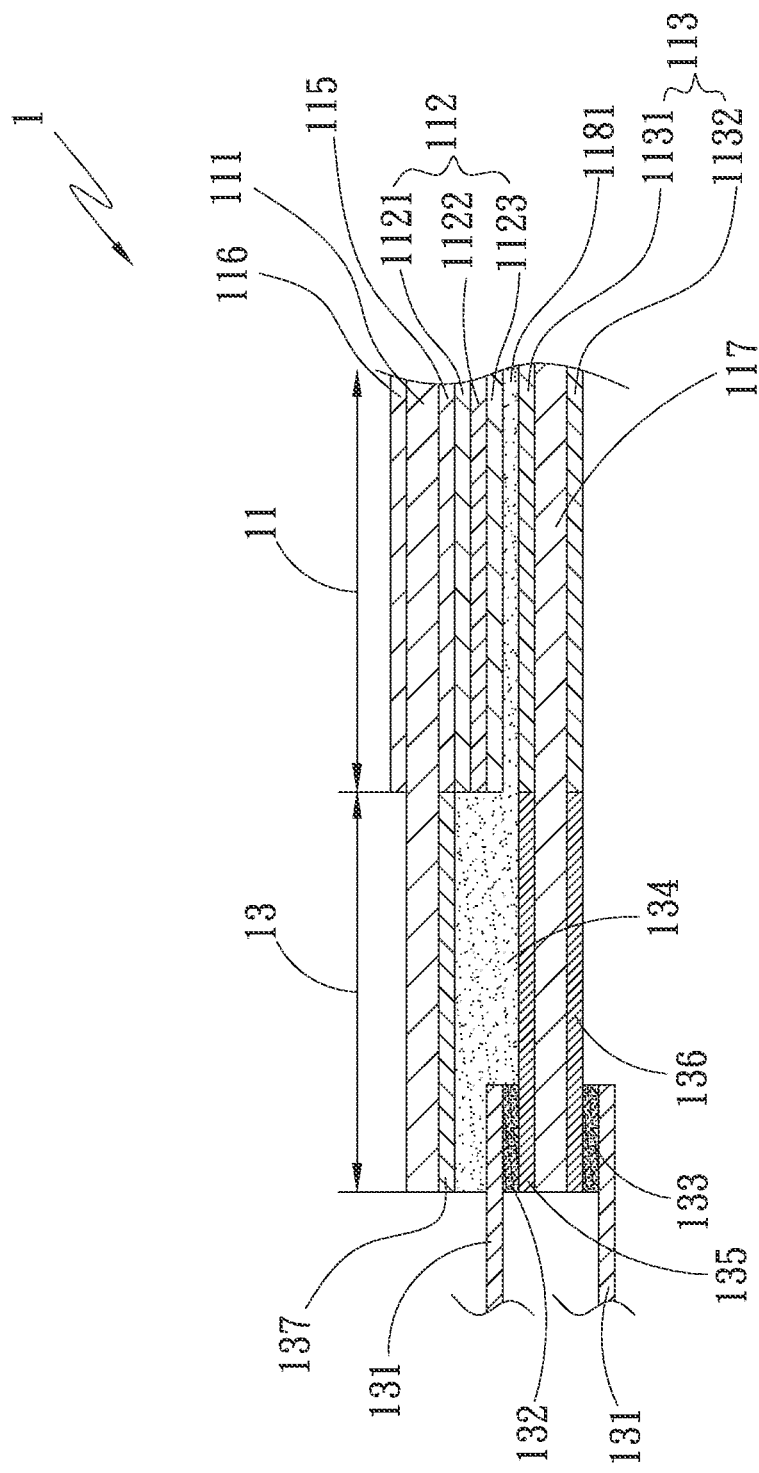
FIG. 5 is a sectional view similar to FIG. 4 showing a variant of the second preferred embodiment of the touch panel of the present invention.

FIG. 4 is a sectional view taken along line A-A of FIG. 1 showing the structure of the touch panel 1 according to a second preferred embodiment thereof, and FIG. 5 is similar to FIG. 4 showing a variant of the second preferred embodiment. The second preferred embodiment and the variant thereof are generally structurally similar to the first preferred embodiment and the variant thereof, respectively, but further include a first anti-reflective layer 115 and a second anti-reflective layer 116. The first anti-reflective layer 115 is provided between the first transparent substrate 111 and the photovoltaic conversion layer 112. More specifically, the first anti-reflective layer 115 has an upper side attached to the lower side of the first transparent substrate 111 and a lower side attached to the first transparent electrode layer 1121 of the photovoltaic conversion layer 112. The first anti-reflective layer 115 enables reduced light reflection and increased light transmissivity.

The second anti-reflective layer 116 is provided on the upper side of the first transparent substrate 111. Like the first anti-reflective layer 115, the second anti-reflective layer 116 enables reduced light reflection and increased light transmissivity. In the second preferred embodiment, the first and the second anti-reflective layer 115, 116 can be formed of silica ($SiO_2$), silicon nitride ($Si_3N_4$) or titanium dioxide ($TiO_2$).

According to the second preferred embodiment, the first and the second anti-reflective layer 115, 116 can be formed on the lower and the upper side, respectively, of the first transparent substrate 111 by way of sputtering deposition without being limited thereto. In practical implementation of the present invention, the first and the second anti-reflective layer 115, 116 can be otherwise formed by applying a gel layer on each of the lower and the upper side of the first transparent substrate 111.

Therefore, by forming the first and the second anti-reflective layer 115, 116 on the lower and the upper side, respectively, of the first transparent substrate 111, it is able to effectively reduce the reflection of incident light from the first transparent substrate 111 and accordingly effectively increase the light that can be absorbed by the photovoltaic conversion layer 112.

Figure 6:
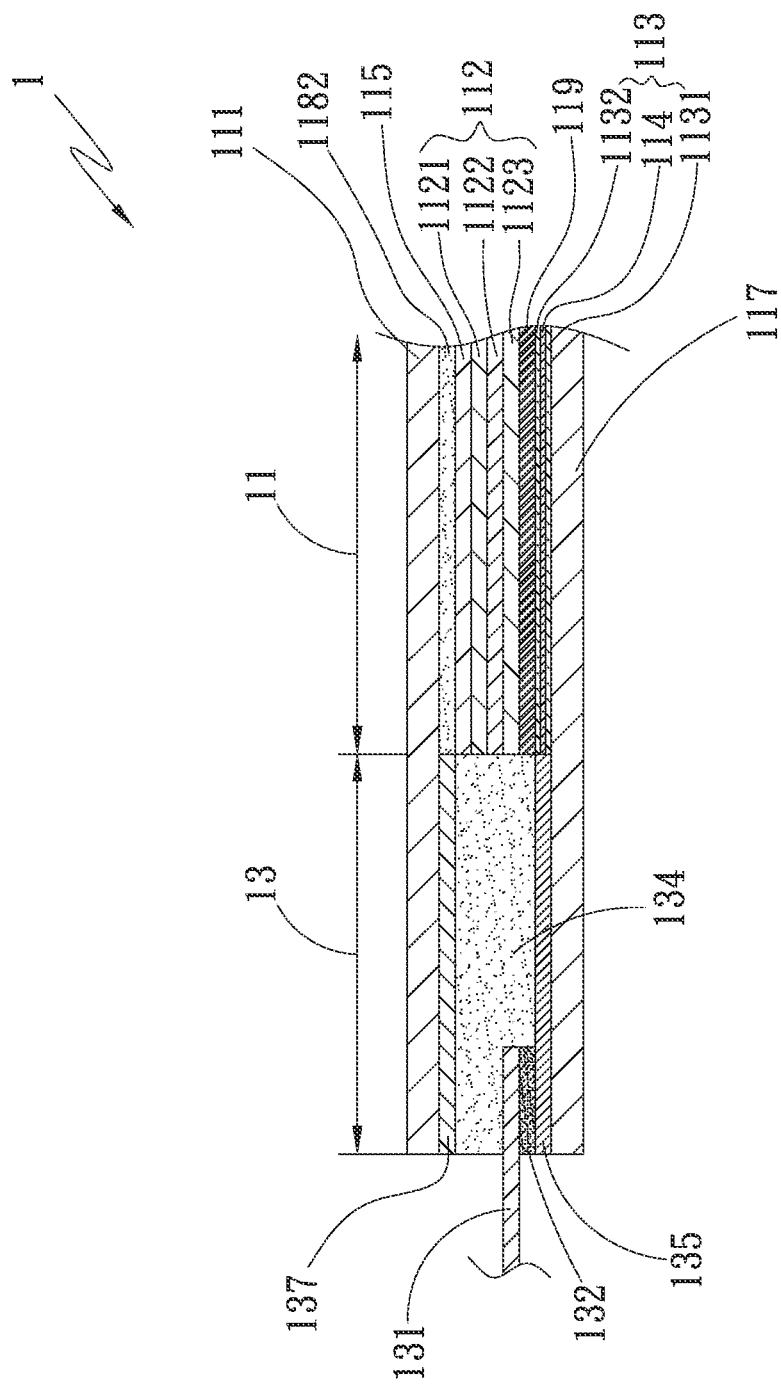
FIG. 6 is a sectional view taken along line A-A of FIG. 1, showing the structure of the touch panel of the present invention according to a third preferred embodiment thereof.

FIG. 6 is a sectional view taken along line A-A of FIG. 1 showing a third preferred embodiment of the touch panel 1 according to the present invention. As shown, the third preferred embodiment is generally structurally similar to the first preferred embodiment, except that it omits the first optical adhesive layer 1181 (see FIG. 2) and additionally includes a first anti-reflective layer 115, a protective layer 119 and a bonding layer 1182. The bonding layer 1182 and the first anti-reflective layer 115 are located between the first transparent substrate 111 and the photovoltaic conversion layer 112. More specifically, the bonding layer 1182 is provided on the lower side of the first transparent substrate 111 for bonding the latter to the first anti-reflective layer 115. Like the first optical adhesive layer 1181, the bonding layer 1182 can be an optical clear adhesive (OCA), an optical clear resin (OCR) or a liquid adhesive lamination (LAL).

The first anti-reflective layer 115 enables reduced light reflection and increased light transmissivity. By attaching the under side of the first transparent substrate 111 to an upper side of the first anti-reflective layer 115 via the bonding layer 1182 and attaching the first transparent electrode layer 1121 of the photovoltaic conversion layer 112 to a lower side of the first anti-reflective layer 115, it is able to effectively reduce the reflection of incident light from the first transparent substrate 111 and accordingly effectively increase the light that can be absorbed by the photovoltaic conversion layer 112.

The protective layer 119 is provided between the photovoltaic conversion layer 112 and the second transparent substrate 117 to replace the first optical adhesive layer 1181. More specifically, the protective layer 119 has an upper side attached to the second transparent electrode layer 1123 and a lower side attached to the upper side of the second transparent substrate 117 and the touch electrode layer 113 provided thereon. The protective layer 119 is provided to protect the touch electrode layer 113 against scratch and other damages. The protective layer 119 works like an overcoat and is an insulating substance, such as silica without being limited thereto. In practical implementation of the present invention, the protective layer 119 can also be formed of silicon nitride or other photoresist-like substances.

Figure 7:
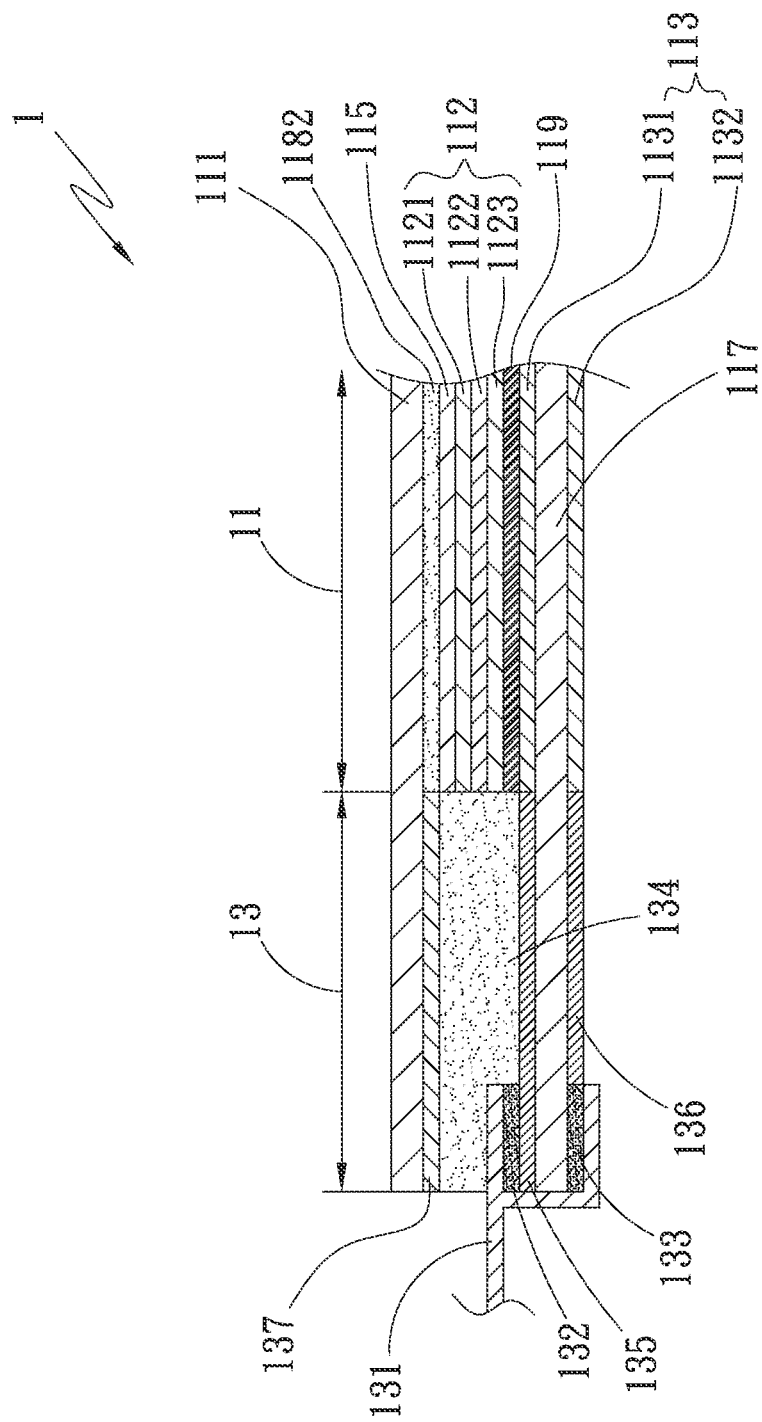
FIG. 7 is a sectional view similar to FIG. 6 showing a variant of the third preferred embodiment of the touch panel of the present invention.

Please refer to FIG. 7 that is a sectional view similar to FIG. 6 showing a variant of the third preferred embodiment of the present invention. As shown in FIG. 7, in practical implementation of the present invention, the touch panel 1 can be otherwise designed to include a touch electrode layer 113 that is a double-sided indium tin oxide (DITO) structure formed on the second transparent substrate 117. In this case, the conductive adhesive layer 132 in the non-touch zone 13 is provided on the upper side of the electrode trace layer 135 to bond to an end of the flexible circuit board 131, so that the electrode trace layer 135 is electrically connected to one end of the flexible circuit board 131 via the conductive adhesive layer 132. That is, the upper side of the electrode trace layer 135 is attached to the conductive adhesive layer 132 and the second optical adhesive layer 134, and the lower side of the electrode trace layer 135 is attached to the upper side of the second transparent substrate 117. Meanwhile, an additional conductive adhesive layer 133 is provided between another end of the flexible circuit board 131 and the lower side of the second transparent substrate 117, and is located adjacent to an additional electrode trace layer 136. With these arrangements, the other end of the flexible circuit board 131, the additional electrode trace layer 136 and the additional conductive adhesive layer 133 are electrically connected to one another, and the additional conductive adhesive layer 133 and the additional electrode trace layer 136 are attached to the lower side of the second transparent substrate 117.

Compared to the prior art, the touch panel 1 according to the present invention has the following advantages: (1) including a photovoltaic conversion layer that has increased light-absorption areas to enable conversion of more light into more electric current; and (2) having extended standby and operation time.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A touch panel with photovoltaic conversion function, comprising a touch zone and a non-touch zone located immediately around the touch zone; the touch zone including a first transparent substrate, a photovoltaic conversion layer, a touch electrode layer and a second transparent substrate; the photovoltaic conversion layer having an upper side attached to a lower side of the first transparent substrate; and the touch electrode layer being formed on an upper side of the second transparent substrate to attach to a lower side of the photovoltaic conversion layer;

wherein the photovoltaic conversion layer includes a first transparent electrode layer, a light-absorption layer and a second transparent electrode layer; the first transparent electrode layer being attached to the lower side of the first transparent substrate, the second transparent electrode layer being attached to the upper side of the second transparent substrate and the touch electrode layer formed thereon, and the light-absorption layer being located between the first and the second transparent electrode layers.

2. The touch panel with photovoltaic conversion function as claimed in claim 1, further comprising a first anti-reflective layer provided between the first transparent substrate and the photovoltaic conversion layer; and the first anti-reflective layer having an upper side attached to the lower side of the first transparent substrate and a lower side attached to the first transparent electrode layer of the photovoltaic conversion layer.

3. The touch panel with photovoltaic conversion function as claimed in claim 2, further comprising a second anti-reflective layer formed on an upper side of the first transparent substrate.

4. The touch panel with photovoltaic conversion function as claimed in claim 1, further comprising a first optical adhesive layer provided between the second transparent substrate and the photovoltaic conversion layer for binding the second transparent electrode layer of the photovoltaic conversion layer to the second transparent substrate and the touch electrode layer formed thereon.

5. The touch panel with photovoltaic conversion function as claimed in claim 3, further comprising a first optical adhesive layer provided between the second transparent substrate and the photovoltaic conversion layer for binding the second transparent electrode layer of the photovoltaic conversion layer to the second transparent substrate and the touch electrode layer formed thereon.

6. The touch panel with photovoltaic conversion function as claimed in claim 4, wherein the touch electrode layer includes a first sensing electrode and a second sensing electrode; and the first and the second sensing electrode being formed on the upper side of the second transparent substrate to cross one another and having an insulating layer provided therebetween.

7. The touch panel with photovoltaic conversion function as claimed in claim 4, wherein the touch electrode layer includes a first sensing electrode and a second sensing electrode; the first sensing electrode being formed on the upper side of the second transparent substrate, and the second sensing electrode being formed on a lower side of the second transparent substrate.

8. The touch panel with photovoltaic conversion function as claimed in claim 4, wherein the non-touch zone includes a flexible circuit board, a conductive adhesive layer, an electrode trace layer, a second optical adhesive layer, and a shielding layer; the shielding layer being attached to the lower side of the first transparent substrate; the second optical adhesive layer being provided between the shielding layer, the flexible circuit board and the electrode trace layer, and being located adjacent to and connected with the first optical adhesive layer; the conductive adhesive layer being provided on an upper side of the electrode trace layer to bond to the flexible circuit board; and the electrode trace layer having a lower side attached to the upper side of the second transparent substrate.

9. The touch panel with photovoltaic conversion function as claimed in claim 2, further comprising a bonding layer provided between the first anti-reflective layer and the first transparent substrate for bonding the first transparent substrate and the first anti-reflective layer to each other.

10. The touch panel with photovoltaic conversion function as claimed in claim 8, further comprising a protective layer provided between the photovoltaic conversion layer and the second transparent substrate; and the protective layer having an upper side attached to the second transparent electrode layer of the photovoltaic conversion layer and a lower side attached to the upper side of the second transparent substrate and the touch electrode layer formed thereon.

11. The touch panel with photovoltaic conversion function as claimed in claim 1, wherein the photovoltaic conversion layer is a thin-film solar cell.

12. The touch panel with photovoltaic conversion function as claimed in claim 1, wherein the first and the second transparent substrate are respectively made of a material selected from the group consisting of polyethylene terephthalate (PET), polycarbonate (PC), polyethylene (PE), polyvinylchloride (PVC), polypropylene (PP), polystyrene (PS), polymethylmethacrylate (PMMA), cyclo olefin copolymer (COC) and glass.

* * * * *